United States Patent [19]
Nishimura

[11] 3,975,898
[45] Aug. 24, 1976

[54] ELECTRONIC TIMEPIECE
[75] Inventor: Izuhiko Nishimura, Suwa, Japan
[73] Assignee: Kabushiki Kaisha Suwa Seikosha, Tokyo, Japan
[22] Filed: July 11, 1975
[21] Appl. No.: 595,262

[30] Foreign Application Priority Data
July 11, 1974  Japan.............................. 49-79466

[52] U.S. Cl................................. 58/23 R; 58/23 A
[51] Int. Cl.².............................................. G04C 3/00
[58] Field of Search............... 58/23 R, 23 A, 50 R, 58/23 AC; 235/92 T

[56] References Cited
UNITED STATES PATENTS

| | | | |
|---|---|---|---|
| 3,777,471 | 12/1973 | Koehler et al. | 58/23 R |
| 3,812,669 | 5/1974 | Wiget | 58/23 R |
| 3,914,931 | 10/1975 | Tsuruishi | 58/23 R |
| 3,922,844 | 12/1975 | Sakamoto | 58/23 R |

Primary Examiner—Ulysses Weldon
Attorney, Agent, or Firm—Blum, Moscovitz, Friedman & Kaplan

[57] ABSTRACT

An electronic timepiece including a variable divider for producing timekeeping signals for the smallest digit of time displayed having a frequency which is not evenly divisible into the frequency produced by the time standard. An oscillator includes a time standard for producing a high frequency time standard signal having a frequency of $K^N$Hz where K and N are positive integers other than O, and a divider adapted to evenly divide the high frequency time standard signal by $K^M$, where M is an integer other than O, and in response thereto produce a $K^{N-M}$ frequency signal having a frequency not evenly divisible by $I^P$, where I is a positive integer other than K and P is an integer. A counter is provided for producing output signals representative of a counting cycle in response to an input pulse signal applied thereto, and a display device is coupled to the counter for displaying each count of the cycle thereof. A detecting circuit is coupled to the counter to detect at least one predetermined count of each counting cycle thereof, and in response to each predetermined count produces a detection pulse. The variable divider is coupled to the detection circuit and has a first and second division ratio. The variable divider is adapted to receive the $K^{N-M}$ frequency signal and in response thereto divides same by a first division ratio, and in response to each said detection pulse applied thereto divides the $K^{N-M}$ frequency pulse by said second division ratio to thereby produce an input pulse signal to the counter having a frequency evenly divisible by $I^P$.

19 Claims, 13 Drawing Figures

ELECTRONIC TIMEPIECE

BACKGROUND OF THE INVENTION

This invention is directed to an electronic timepiece, and in particular to an electronic timepiece variable divider circuit for applying timekeeping signals to the smallest digit of time displayed having a frequency not evenly divisible into the frequency of the electronic timepiece time standard.

The accuracy and precision of electronic timepieces has been due in large measure to the accuracy of quartz crystal vibrators utilized as a time standard. Because the accuracy of a quartz crystal time standard is determined by the amount of deviation between a selected natural frequency of vibration and the actual frequency at which the time standard vibrates, considerable efforts are made during manufacture to minimize such deviation therebetween.

It has been found that the variance in accuracy of quartz crystal vibrators decreases proportionally with an increase in the number of quartz crystal vibrators having the same operating characteristics manufactured during a specific interval of time, such as a month. Accordingly, a natural frequency of 32,768 Hz($2^{15}$) has been selected as the operating frequency for optimizing natural frequency of the vibrator, such a natural frequency enabling divider circuitry comprised of N-series connected binary divider stages to be utilized to effect division of the natural frequency $2^{15}$ by $2^N$. Accordingly, in electronic timepieces operating in a timekeeping mode, the smallest digit of time displayed is seconds, and it is only necessary to divide the high frequency time standard signal produced by the oscillator circuit by $2^{15}$ to thereby apply a 1 Hz low frequency timekeeping signal to a counter having a display element associated therewith. Nevertheless, when a chronographic timekeeping mode is desired, a binary divider circuit capable of dividing the natural frequency $2^{15}$ Hz into a 1 Hz frequency signal, of the type utilized in timekeeping electronic timepieces is less than completely satisfactory. Although a time standard having a higher natural frequency than $2^{15}$ Hz can be utilized, because of the advantages which inure to manufacturing quartz crystal vibrators in bulk at the same natural frequency of vibration, such a solution is less than completely satisfactory. The other alternative is to utilize a binary divider circuit having a division ratio less than $2^{15}$. Nevertheless, because each of the digits of time less than one second have a decimal count, and require the input pulses applied thereto to have frequency of $10^K$, where K is a positive integer, the signal produced by a binary divider circuit cannot be utilized as an input to the lowest digit of time counters producing display signals.

SUMMARY OF THE INVENTION

Generally speaking, in accordance with the instant invention, an electronic timepiece including a variable divider is provided. The timepiece includes oscillator circuitry for producing a high frequency time standard signal having a frequency of $K^N$Hz, where K and N are positive integers other than 0, and divider circuitry adapted to evenly divide the high frequency time standard signal by $K^M$, where M is an integer other than 0, and produce a $K^{N-M}$ frequency signal having a frequency not evenly divisible by $I^P$, where I is a positive integer other than K and P is an integer. A counter is adapted to produce output signals representative of a counting cycle in response to an input pulse signal applied thereto, and a display device is coupled to the counter for displaying each count of the cycle thereof. A detecting circuit is coupled to the counter for detecting at least one predetermined count of each cycle thereof, and in response to each predetermined count produces a detection pulse. A variable divider having a first and second division ratio is coupled to the detection circuit. The variable divider is adapted to receive the $K^{N-M}$ frequency signal and in response thereto divides same by a first division ratio and in response to each said detection pulse applied thereto divide the $K^{N-M}$ frequency pulse by the second division ratio to thereby apply an input pulse signal to the counter having a frequency divisible by $I^P$.

Accordingly, it is an object of this invention to provide an improved electronic timepiece utilizing a time standard having a natural frequency of $2^{15}$ Hz (32,768 Hz) and displaying time having a period less than 1 second.

Still another object of this invention is to provide an electronic timepiece including improved divider circuitry adapted to receive a time standard signal having a frequency of $K^N$, where K and N are positive integers and produce a lower frequency signal having a frequency $I^P$, where I is a positive integer other than K, and P is an integer, and lower frequency signal $I^P$ does not divide evenly into $K^N$.

Still a further object of the instant invention is to provide an accurate electronic digital display electronic timepiece for producing a chronographic display of elapsed time signals and a timekeeping display of the present time.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
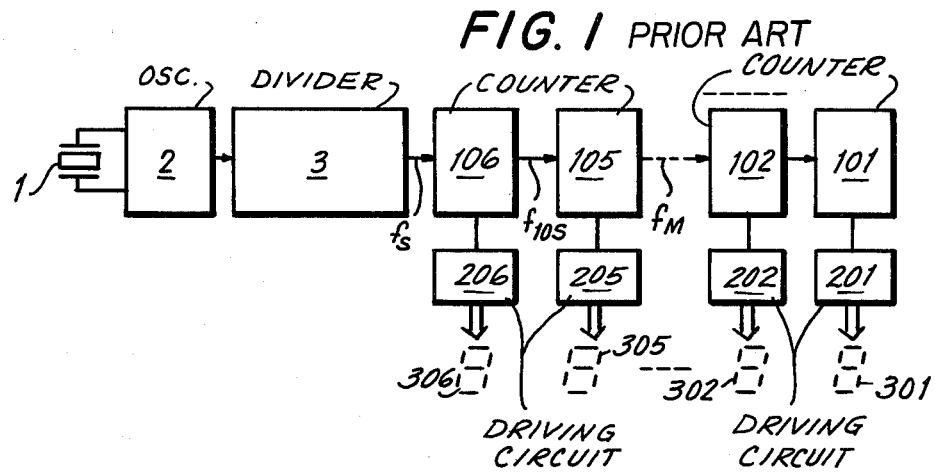
FIG. 1 is a block circuit diagram of an electronic timepiece including a digital display for displaying seconds, minutes and hours constructed in accordance with the prior art.

Referring now to FIG. 1, an electronic timepiece constructed in accordance with the prior art is depicted. An oscillator circuit 2 includes a quartz crystal vibrator 1 having a natural frequency of $2^N$Hz, where N equals 15 (32,768 Hz) for producing a high frequency time standard signal having a frequency of $2^{15}$ Hz. The frequency time standard signal is applied to binary divider circuit 3, which binary divider circuit has a division ratio of $½^{15}$ and in response thereto produces an output signal having a frequency of 1 Hz and, accordingly, a period of 1 second. One second signal $f_s$ is counted by seconds counter 106 which counter produces a 10-seconds signal $f_{10S}$. Similarly series connected counter 105 produces a 1 minute $f_M$ in response to six pulses of $f_{10S}$ and the remaining counters through tens of hours counter 101 are counted in the same manner. Respectively coupled to counters 106 through 101 are driving circuits 206 through 201 for receiving signals representative of the count of the respective counters 106 through 101 and in response thereto producing signals to be applied to 7-segment displays 306, 305, ... 301 respectively coupled thereto to display the time counted by said counters. Accordingly, the smallest digit of time displayed is 1 second.

Figure 2:
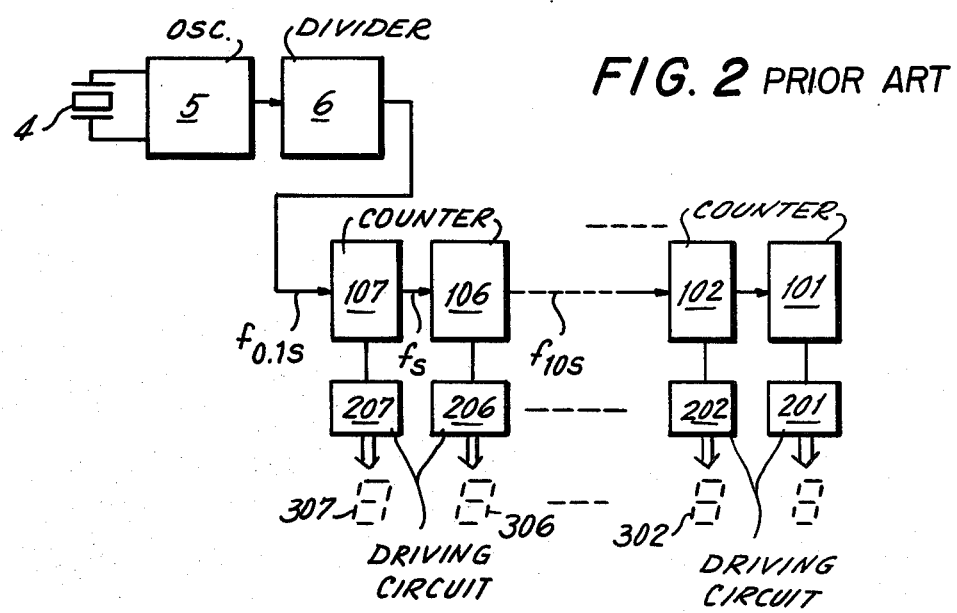
FIG. 2 is a block circuit diagram of an electronic timepiece including a digital display for displaying tenths of seconds, seconds, minutes and hours in accordance with the prior art.

Referring now to FIG. 2, a digital display electronic timepiece adapted to display tenths of seconds is depicted, like reference numerals being utilized to denote like elements depicted in FIG. 1. In order to produce a display of tenths of seconds, an additional decimal counter 107 and associated drive circuit 207 and display element 307 are required. In order to effect counting of counter 107, a low frequency signal $f_{0.1S}$ having a frequency of 10 Hz and hence a period of one-tenth of a second is applied thereto. In order to obtain signal $f_{0.1S}$ a quartz crystal vibrator 4 having a frequency of vibration of 40,960 Hz is utilized as a time standard in oscillator circuit 5 to produce a high frequency time standard signal having such a frequency. Accordingly, in response to a high frequency time standard signal of 40,960 Hz being applied thereto, divider circuit 6 divides same and produces low frequency signal $f_{0.1S}$ for application to decimal counter 107.

Figure 3:
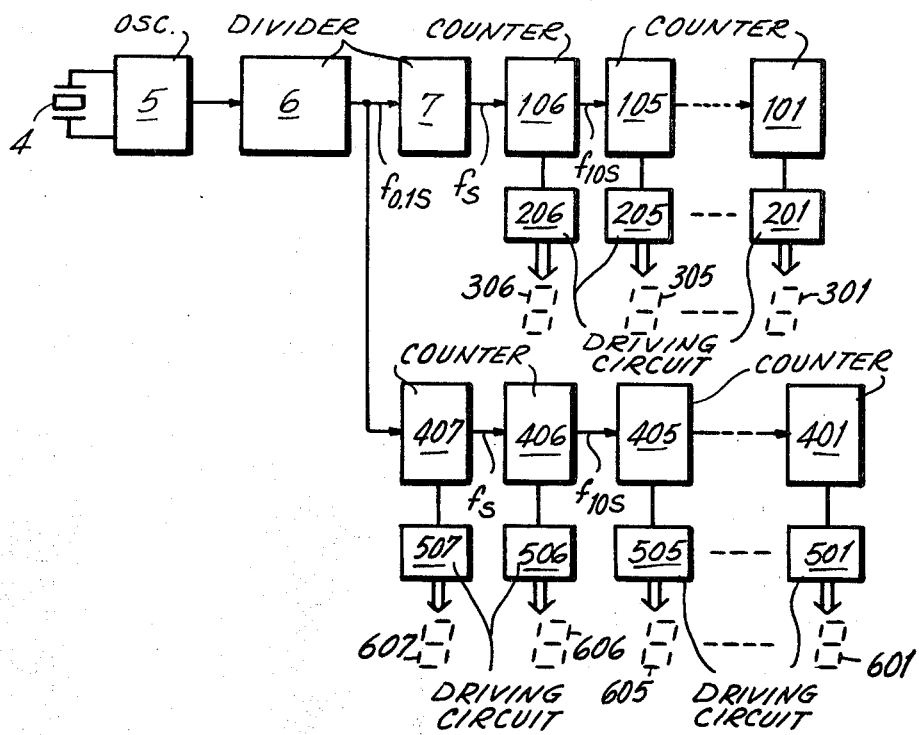
FIG. 3 is a block circuit diagram of an electronic timepiece including first display means for displaying seconds, minutes and hours and chronographic display means for displaying tenths of seconds, seconds, minutes and hours, constructed in accordance with the prior art.

Referring now to FIG. 3, an electronic timepiece including a further chain of series connected counters 407 through 401 for producing chronographic signals representative of elapsed time is depicted, like reference numerals being utilized to denote like elements depicted in FIGS. 1 and 2. The chronographic chain of counter includes a decimal counter 407 for producing counting signals having a period of tenths of seconds. Thus, counter 407 like decimal counter 107 described above, in response to low frequency signal $f_{0.1S}$ applied thereto, produces signals representative of tenths of seconds, and counters 406, 405, ... 401, respectively produce signals representative of seconds, tens of seconds, ... tens of hours in a conventional manner. Driving circuits 507, 506, 505, ..., 501 are adapted to receive the respective counted signal outputs from counters 407, 406, ..., 401 and apply same to 7-segment chronographic displays 607, 606, ..., 601 in the same manner discussed above. By providing quartz crystal vibrator 4 with a natural frequency of 40,960 Hz, the high frequency time standard signal produced by oscillator circuit 5 is divided by divider circuit 6 into a low frequency signal $f_{0.1S}$ having a frequency of 10 Hz. Accordingly since counter chain 106, 105, 111, 101 produces counting signals representative of present time and does not include means for displaying tenths of seconds, it is only necessary to provide a divider 7 for dividing down the 10 Hz signal $f_{0.1S}$ to a 1 Hz signal $f_S$ to be applied to seconds counter 106. Additionally, operation of the chronographic divider chain to effect starting, stopping, re-starting and return to 0 are effected by external switches of the type illustrated and described in U.S. Pat. No. 3,795,099, issued on Mar. 5, 1974.

Figure 4:
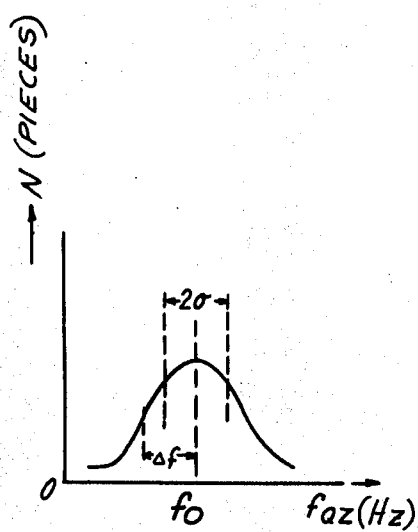
FIGS. 4 and 5 are graphical illustrations comparing the increase in accuracy of quartz crystal vibrators as the number of same being manufactured is increased.
Figure 5:
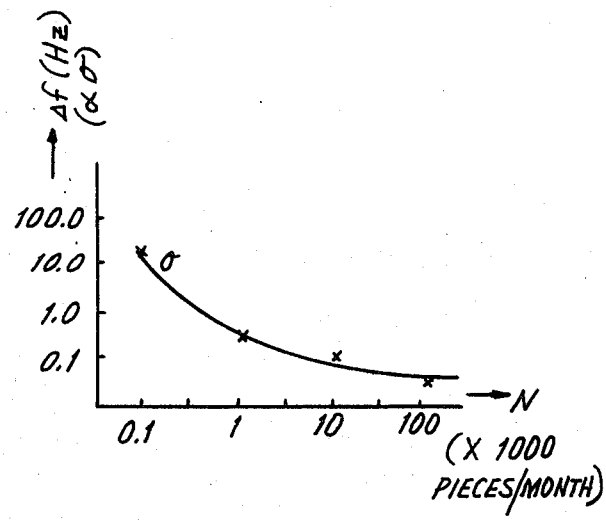

Nevertheless, certain disadvantages are inherent in digital display chronographic electronic timepieces having tenths of seconds displays of the type depicted in FIG. 3. When the smallest unit of time to be displayed is other than 1 second, the quartz crystal vibrator having a natural frequency of $2^N$Hz, as a time standard will not provide a high frequency time standard signal which can be evenly divided to produce a low frequency signal having the smallest unit of time displayed. A further disadvantage which inures to the circuit depicted in FIG. 3 is the requirement of a divider 7 having four flip-flops to provide a 16-pulse count when only a 10-pulse count is needed. Nevertheless, the first disadvantage noted above is more particularly troublesome due to manufacturing consideration which must be considered when producing quartz crystal vibrators. Specifically, when quartz crystal vibrators are manufactured to have natural frequency $f_0$, the number of vibrators having a natural frequency of oscillation varying from $f_0$ is illustrated in FIG. 4 as $f$ where $f_{qz}$ is the natural frequency of quartz crystal and N is the number of pieces of quartz crystal manufactured. Because the accuracy of an electronic timepiece, and the ability to adjust same during the early stages of manufacturing are dependent on the variance between the natural frequency of the crystal and $f_0$ being at a minimum, it is necessary to manufacture such quartz crystal vibrators in a way which minimizes the variance between the natural frequency thereof and $f_0$. As illustrated in FIG. 4, the larger the number of vibrator pieces manufactured, the greater the minimization of $f$. The standard deviation $\sigma$ is an indicator of the manner in which the variance $\Delta f$ decreases in accordance with an increase in the amount of quartz crystal vibrators manufactured. Referring specifically to FIG. 5, the variance in the standard deviation of sampled vibrators in relation to actually manufactured amounts of vibrators during a specific month are illustrated. Thus, when the number of manufactured vibrators in a month increases to 10,000 vibrators, the standard deviation is improved by one decimal figure. Moreover, as the rate of production increases past 10,000 vibrators, the standard deviation further decreases, thereby demonstrating that the more quartz crystal vibrators produced during a predetermined period of manufacture, the greater the reduction in the variance between the natural frequency at which same vibrate and a natural frequency $f_0$ at which same should vibrate to produce the accuracy desired. Nevertheless, because it is required to manufacture each of the vibrators at the same natural frequency, and further because the natural frequency selected is $2^n$ Hz to allow same to be divided evenly and produce a 1 Hz output signal having a 1 second period, the electronic timepiece illustrated in FIG. 3 wherein a digit of time less than seconds is displayed is less than completely satisfactory because of the requirement by same of a quartz crystal vibrator vibrating at a frequency other than $2^n$Hz. Accordingly, the instant invention is characterized by electronic timepiece circuitry for providing time display of less than 1 second and utilizing a quartz crystal vibrator having a natural frequency of $2^n$ Hz.

Figure 6:
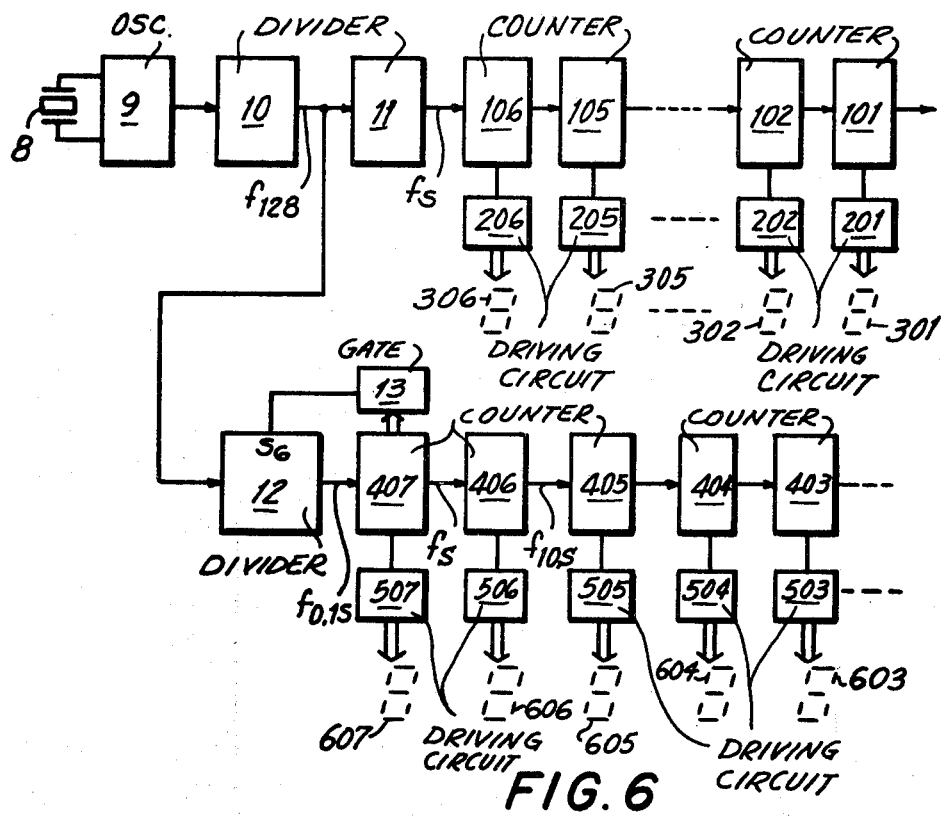
FIG. 6 is an block circuit diagram of an electronic timepiece including a first time display for displaying seconds, hours and minutes and further including a chronographic display for displaying tenths of seconds, seconds, minutes ands hours, constructed in accordance with a preferred embodiment of the instant invention.

Reference is now made to FIG. 6, wherein an electronic timepiece having a first digital display including 7-segment displays 306, 305, ..., 301 for displaying present time. 7-segment displays 607, 606, ..., 603, provide for a chronographic display of elapsed time, like reference numerals being utilized to denote like elements depicted above. An oscillator circuit 9 including a quartz crystal vibrator 8 having a natural frequency of $2^{15}$ Hz (32,768 Hz), produces a high-frequency time standard signal having a frequency of $2^{15}$Hz. A divider circuit 10 having a division ratio of $2^7$ in response to the high-frequency time standard signal applied thereto produces a lower frequency signal $f_{128}$ having a frequency of 128 Hz and a period of 1/128 seconds. The lower frequency signal $f_{128}$ is applied to a divider circuit 11 having a division ratio of 1/28, which divider produces a low-frequency timekeeping signal $f_S$ having a frequency of 1 Hz and a period of 1 second. 1 Hz signal $f_S$ is applied to the present time counter chain 106, 105, ..., 101 and present time is displayed in the manner discussed above in FIG. 1.

Additionally, lower frequency $f_{128}$ is applied to a variable divider 12 which divider in response thereto applies a 1/10th of a second signal $f_{0.1S}$ having a frequency of 10 Hz to the first counter 407 of the chronographic counter chain adapted to produce the chronograhic display of lapsed time.

Figure 8:
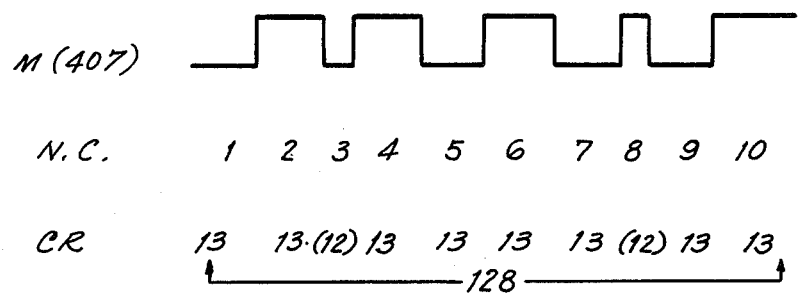
FIGS. 8 and 9 are wave diagrams illustrating the operation of the chronographic counter producing tenths of second signals for display depicted in FIG. 6.
Figure 9:
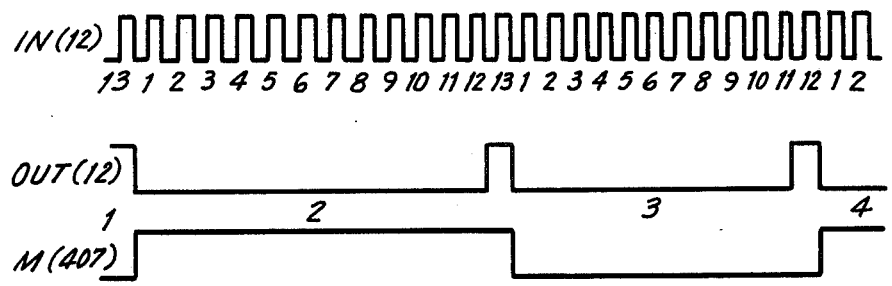

Accordingly, variable divider 12 in response to lower frequency signal $f_{128}$ having a frequency of 128 Hz divides same into a signal of approximately 10 Hz. In order to effect such division, variable divider 12 has a first division ratio of 1/12 and a second division ratio of 1/13, and effects division of the signal $f_{128}$ by 1/13 unless gate circuit 13 applies a signal to terminal $S_6$ whereafter variable divider 12 divides signal $f_{128}$ by 12. FIG. 9 illustrates the manner in which the signal $f_{0.1S}$ is applied to counter 407 to produce the count thereof. Specifically, M(407) is the counting mode of the counter 407 and N.C. illustrate the counting cycle thereof from 1 through 10. Accordingly, the counting cycle of the counter is responsive to the division ratio of variable divider 12 depicted in FIG. 8 as CR. Thus, each count of the counter cycle N.C., with the exception of N.C. = 3 and 8, is responsive to a division ratio of 1/13, namely, that 13 pulses are applied to variable divider 12 to produce a pulse for changing the count of counter 407 to the next count in the cycle. Nevertheless, when the count of counter 407 is 3 and 8, gate circuit 13 detects same and applies a signal to variable divider 12 to change the division ratio thereof to 1/12 and hence produce a change to the next count of the cycle in response to 12 pulses of signal $f_{128}$ being aplied to divider 12. Accordingly, counter 407 is counted through a complete counting cycle in response to 128 pulses applied to variable divider 12, and at the end of each complete counting cycle of counter 407. An output signal having a frequency of 1 Hz and hence a period of 1 second is produced. FIG. 9 illustrates an enlarged view of the first few counting cycles of counter 407 in response to the input to variable divider 12. Thus, for example, when the counting cycle of counter 407 is 2, after 12 pulses are applied to variable divider 12, same produces output pulses during the 13th input pulse applied thereto, the falling edge thereof effecting a change in count of counter 407. Similarly, when the count of counter 407 is 3, gate 13 applies a detection signal to variable divider 12 to change the division ratio thereof to 1/12. After 11 pulses, variable divider 12 produces a pulse the falling edge of which corresponds to the end of the 12th pulse and effects a further advancement of the count cycle of counter 407 to a count of 4. Although the output signal $f_S$ of counter 407 has the same frequency at $f_S$ as the output of divider 11, during the counting cycle of the counter, the count of counter 10 is leading or lagging an actual frequency at 1/10th of a second timing intervals indicated below as follows:

| 1/10 timing | approximative error | 1/10 timing | approximative error |
| --- | --- | --- | --- |
| 1/10 | −0.00156 | 6/10 | −0.00156 |
| 2/10 | −0.00312 | 7/10 | −0.00312 |
| 3/10 | +0.00312 | 8/10 | +0.00312 |
| 4/10 | +0.00156 | 9/10 | +0.00156 |
| 5/10 | ±0 | 10/10 | ±0 | wherein "−" means delay and "+" means advance with respect to actual time at each 1/10th of a second interval. From the above table it is understood that the timing error during each 1/10th of a second interval does not create any difficulties since same averages to 0 every 5/10ths of a second and 10/10ths of a second thereby not providing a cumulative error to the count of the chronographic counter chain.

Figure 11:
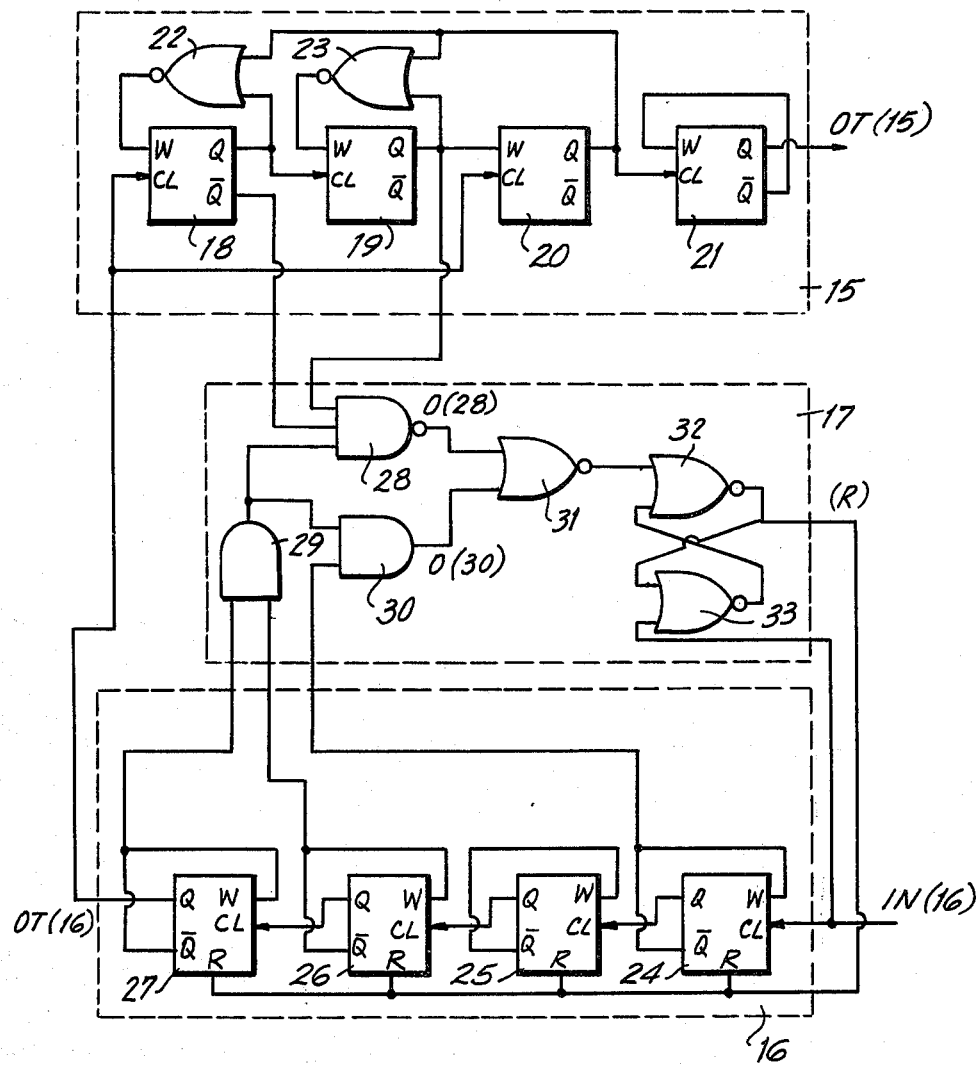
FIG. 11 is a detailed circuit diagram of the variable divider and counter for producing tenths of second signals depicted in FIG. 6.

Reference is now made to FIG. 11 wherein a variable divider 16, decimal counter 15 and detecting circuit 17 respectively correspond to variable divider 12, counter 407 and gate 13, and illustrate the actual circuit arrangement of same. Decimal counter 15 is comprised of data-type flip-flops 18, 19, 20 and 21 having clock inputs CL, positive outputs Q, negative outputs $\bar{Q}$ and write-in inputs W, respectively. Additionally, counter circuit 15 includes NOR gates 22 and 23 each having as a first input the positive output Q of data-type flip-flop 20 and as further inputs the positive output Q of flip-flop 18 and positive output Q of flip-flop 19, the outputs thereof being respectively applied to the write-in inputs of flip-flop 18 and flip-flop 19 to effect a decimal count thereby. The count of each of the flip-flops 18 through 21 is respectively depicted as QC1, QC2, QC3 and QC4 in FIG. 12.

Variable divider 16 is comprised of four-series-connected flip-flops 24, 25, 26 and 27 each having a clock input CL, a write-in input W, a positive output Q and a negative output $\bar{Q}$. The count of flip-flops 24, 25, 26, 27 are respectively depicted as $QC_1$, $QD_2$, $QD_3$ and $QD_4$ in FIG. 13.

Detection circuit 17 includes a R-S flip-flop circuit comprised of NOR gates 32 and 33, the output R thereof being applied to the reset terminals R of flip-flops 24, 25, 26 and 27 of variable divider 16. A first input of NOR gate 33 is the input signal to the variable divider 16. A further set-reset input to the R-S flip-flop defined by NOR gates 32 and 33 is produced by the output of NOR gate 31 having as respective input signals 0(30) produced by AND gate 30 and 0(28) produced by NAND gate 28. The respective inputs to NAND gate 30 are the negative output $\bar{Q}$ of flip-flop 24 and the output of AND gate 29, which AND gate has as its two inputs the negative outputs $\bar{Q}$ of flip-flops 26 and 27. In addition to the output of AND gate 29, NAND gate 28 has as its two further inputs the negative output $\bar{Q}$ of decimal counter flip-flop 18 and the positive output Q of decimal counter flip-flop 19. In operation, when output 0(28) and NAND gate 28 is a 0, flip-flops 24 through 27 comprising variable divider 16 count to 13, and in response to the 14th pulse applied at the input thereof causes the output 0(30) of AND gate 30 to be changed to a 1, thereby effecting an inverting of the R-S flip-flop comprised of NOR gates 32 and 33 to thereby produce an output R having a binary state of 1, which output R is applied to reset terminals R of flip-flops 24 through 27 to effect resetting of same to 0. Resetting of flip-flops 24, 25, 26 and 27 to zero once again turns the output of AND gate 30 to 0. Similarly, the input IN(16) of divider 16 is applied to R-S flip-flop NOR gate 33 to instantaneously reset same and thereby turn the output thereof R to 0. Accordingly, as long as the output 0(28) of NAND gate 28 remains 0 variable divider 16 will produce a 1 at the output of AND gate 30 after each 13 pulses are applied to variable divider 16 to effect a division ratio of 1/13.

Figure 12:
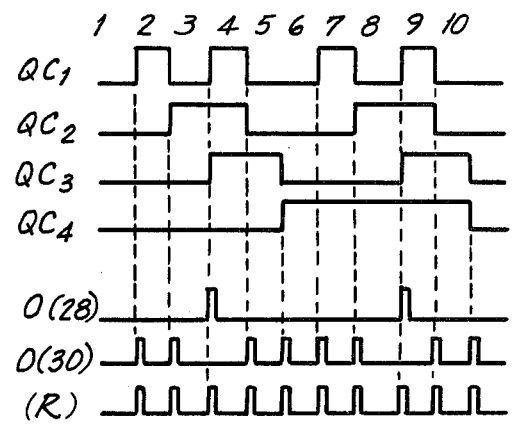
FIGS. 12 and 13 are wave diagrams illustrating the operation of the variable divider circuit depicted in FIG. 11.
Figure 13:
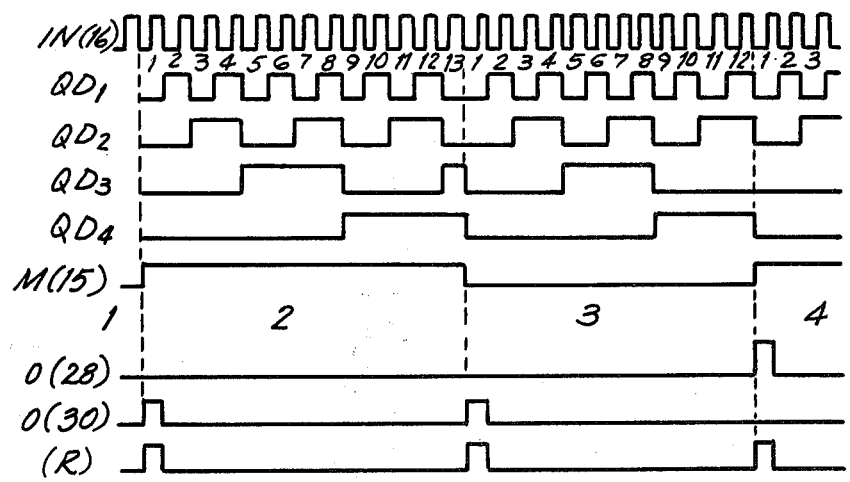

When the count of flip-flops 18, 19, 20 and 21 comprising decimal counter 15 are such that the positive output Q of flip-flop 18 is 0 and the output of positive output Q of flip-flop 19 is 0 the output of NAND gate 28 becomes 1, when the count of variable divider 16 is 13. In response to the output of NAND gate 28 being a 1 the output of the R-S flip-flop is set to 1 whereafter each of the flip-flops 24 through 27 is reset to 0, and instantaneously begins counting and effects resetting of detection circuit 17 and hence output 0(28) to 0. Accordingly, the count of decimal counter 15 is such that the count of positive output Q is 0 and positive Q of flip-flop 19 is 1 when the counting cycle is at a count of 3 or 8 to thereby effect resetting of the variable divider 16 after 12 pulses are applied thereto to cause same to operate as a 1/12 divider. Accordingly, as illustrated in FIGS. 12 and 13, outputs at 0(28) are produced after the counts of decimal counter 15 are 3 and 8 and remain at 0 in response to the remaining counts thereof. Similarly, the output 0(30) of AND GATE 30 is 1 after each count of the decimal counter other than 3 and 8 thereby effecting a 1/13 division ratio.

Accordingly, the instant invention is characterized by a variable divider circuit adapted to produce a 10 Hz ($10^1$) signal in response to a 128 Hz ($2^7$) signal applied thereto. If it is necessary to apply a signal having a 50% duty cycle to the input of decimal counter 15, the lower frequency signal applied to the variable divider can be a 256 Hz signal ($2^{7+N}$, where N equals 1) and an additional binary divider stage is coupled at the output of variable divider 16 (the number of additional binary divider stages being equal to N where the lower frequency signal is $2^{7+N}$). It is further noted that although the embodiment described above relates to the producing of a 10 Hz signal, obtaining of signals of other frequencies can be obtained thereby. For example, a signal having a frequency of approximately 100 Hz can be obtained from a frequency standard of 40,960 Hz and a 1,000 Hz signal can be obtained from a time standard of 131,076 Hz. It is additionally noted that the circuit arrangement depicted in FIG. 11 is particularly adapted to be integrated on a circuit chip and thus is suitable for use in small-sized electronic wristwatches.

Figure 7:
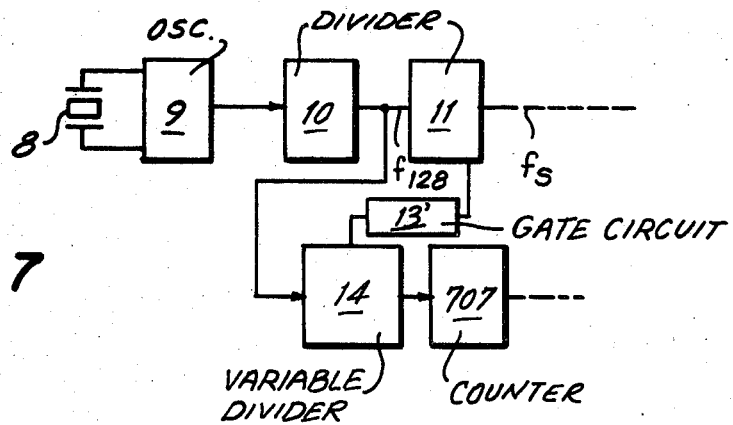
FIG. 7 is a block circuit diagram of a portion of an electronic timepiece including a first time display for displaying seconds, minutes and hours and a further chronographic display for displaying tenths of second, seconds, minutes and hours, constructed in accordance with an alternate embodiment of the instant invention.
Figure 10:
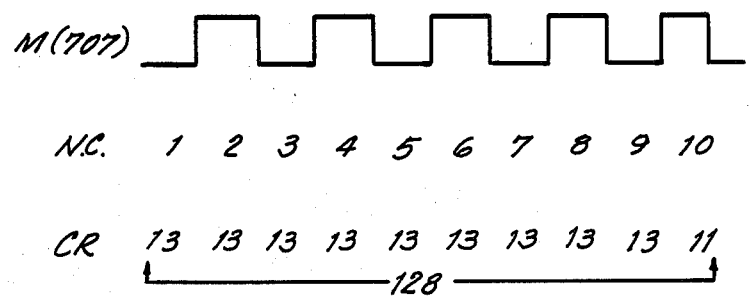
FIG. 10 is a wave diagram illustrating the operation of the counter producing tenths of second display signals depicted in FIG. 7.

Reference is now made to FIG. 7 where an alternate embodiment of a chronographic timepiece constructed in accordance with the instant invention is depicted, like reference numerals being utilized to denote like elements depicted above. Accordingly, although divider circuit 10 produces a lower frequency signal $f_{128}$ having a frequency of 128 Hz, such signal is applied to divider 11, which divider is comprised of series-connected binary divider stages having a division ratio of $\frac{1}{2}^7$ and produces an output signal $f_s$ having a period of 1 second to the subsequent counter stages in the counter chain associated therewith. Additionally, in response to the binary count of divider circuit 11 being 117, a gate circuit 13' detects same and effects a resetting of divider 14 after same has counted 11 pulses. Accordingly, as depicted in FIG. 10, divider 14 has a division ratio of 1/13 for the first nine counts of decimal counter 707, and has a second division ratio of 1/11 for the tenth count thereof. Accordingly, instead of using the signal produced by the chronographic decimal counter 707 to change the division ratio of variable divider 14, the signal in the counter chain producing the timing signals is utilized. Nevertheless, because a maximum error of 0.014 seconds can be introduced into the signal counted by variable divider 14, and because this cannot be utilized in chronographic timepiece having a set to zero function of 1 second or less, same does not have the same applications as the preferred embodiment discussed above.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. In an electronic timepiece including an oscillator means for producing a high frequency time standard signal having a frequency of $K^N$ Hz, where K and N are positive integers other than zero, and divider means adapted to evenly divide said high frequency time standard signal by $K^M$, where M is an integer other than zero, and produce a $K^{N-M}$ frequency signal having a frequency not evenly divisible by $I^P$, where I is a positive integer other than K and P is an integer, counter means adapted to produce output signals representative of a counting cycle in response to an input pulse signal applied thereto, and display means coupled to said counter means for displaying each count of the cycle thereof, the improvement comprising detecting means for detecting at least one predetermined count of each counting cycle thereof, and in response to each predetermined count detected, producing a detection pulse, and variable divider means coupled to said detection means and having a first and second division ratio, said varible divider means being adapted to receive said $K^N/_3{}^M$ frequency signal and in response thereto divide same by a first division ratio and in response to each said detection pulse applied thereto divide said $K^{N-M}$ frequency signal by said second division ratio, to thereby apply an input pulse signal to said counter means having a frequency evenly divisible by $I^P$.

2. An electronic timepiece as claimed in claim 1, wherein $I = 10$.

3. An electronic timepiece as claimed in claim 2, wherein said counter means is a decimal counter having a counting cycle of 10.

4. An electronic timepiece as claimed in claim 3, wherein $K = 2$.

5. An electronic timepiece as claimed in claim 4, wherein $N = 15$, and $M = 8$.

6. An electronic timepiece as claimed in claim 5, wherein said first division ratio is 1/13, and said second division ratio is 1/12 and said predetermined counts of said counting cycle are 3 and 8.

7. An electronic timepiece as claimed in claim 3, and including a plurality of series-connected chronographic counters coupled to said counter means for producing chronographic signals in response to an output signal produced by said counter means and further display means associated with each said counter means for displaying the count thereof, said first display means and further display means effecting a chronographic display of elapsed time.

8. An electronic timepiece as claimed in claim 7, and including timekeeping divider means adapted to receive said $K^{N-M}$ frequency signal and divide same by $K^{N-M}$ to produce a 1 Hz low frequency signal, series-connected timekeeping counter means adapted to receive said 1 Hz signal and in response thereto produce timekeeping signals representative of present time, and display means associated with each said series-connected timekeeping counter means for displaying the timekeeping signals produced thereby.

9. An electronic timepiece as claimed in claim 8, wherein $P = 1$.

10. An electronic timepiece as claimed in claim 1, wherein said variable divider means includes series-connected flip-flop means adapted to receive said $K^{N-M}$ frequency signal and in response to each pulse thereof effect an indexing of the binary count thereof by 1, said detecting means including first circuit means coupled to said variable divider flip-flop means for detecting a first predetermined binary count thereof and in response to detecting said predetermined binary count producing a reset pulse, and reset pulse means adapted to receive said reset pulse and in response thereto apply a resetting pulse to said variable divider flip-flop means to reset the count thereof to zero, said variable divider flip-flop means producing an output pulse in response to resetting of the count thereof having a frequency equal to the $K^{N-M}$ frequency signal divider by said first division ratio.

11. An electronic timepiece as claimed in claim 10, wherein said counter means includes series-connected flip-flop means for receiving said input pulse signals and in response to each pulse thereof effect an indexing of the binary count thereof to count through said counting cycle, said counting cycle being equal to I, and in response to said counter flip-flop means counting through said counting cycle produce an output signal having a frequency equal to $I^{P-1}$ Hz.

12. An electronic timepiece as claimed in claim 11, wherein said detection means for detecting a predetermined count of each counting cycle includes a second circuit means coupled to said variable divider flip-flop means for detecting a further binary count thereof, and in response to the coincident detection of each predetermined count of said counting cycle, and said further binary count of said variable divider flip-flop means, apply a reset pulse to said reset means to cause same to immediately apply said resetting signal to said variable divider flip-flop means and reset the count of said variable divider means to zero, said variable divider flip-flop means producing an output pulse in response to resetting of the count thereof having a frequency equal to the $K^{N-M}$ frequency divided by said second division ratio.

13. An electronic timepiece as claimed in claim 12, wherein said variable divider flip-flop means is comprised of four series-connected flip-flops, the predetermined binary counts thereof at which same are reset defining respective division ratios of $1/B-1$, where B is a positive integer.

14. An electronic timepiece as claimed in claim 13, wherein $K = 2$, $N-M = 128$, and the respective first and second predetermined counts of said variable divider flip-flop means are 14 and 13.

15. An electronic timepiece as claimed in claim 14, wherein said counter flip-flop means are comprised of four series-connected data-type flip-flops and feedback means coupled to write-in terminal thereof to produce a counting cycle of 10, the counts of 3 and 8 being the predetermined counts detected by said detecting means, said second detection circuit means in response to the detection of said respective 3 and 8 counts and said predetermined binary count of 13, effecting resetting of said variable divider flip-flop means.

16. An electronic timepiece as claimed in claim 12, wherein said reset means includes set-reset flip-flop means, said set-reset flip-flop means being adapted to receive said $K^{N-M}$ frequency signal, and in response to each said reset pulse applied thereto being set to apply said resetting pulse to said variable divider flip-flop means to effect resetting of the count thereof to zero, and in response to the next pulse of the $K^{N-M}$ frequency signal applied thereto, being reset to thereby terminate the application of said resetting pulse to thereby terminate the application of said resetting pulse to said variable divider flip-flop means.

17. In an electronic timepiece including oscillator means for producing a high frequency time standard signal having a frequency of $2^N$ Hz, where N is an integer other than zero, divider means adapted to receive said high frequency time standard signal and in response thereto produce a $2^{N-M}$ frequency signal having a frequency not evenly divisible by $10^P$, where M and P are integers other than zero, first timekeeping divider means including series-connected binary divider stages for receiving said $2^{N-M}$ frequency signal and in response thereto produce a low frequency timekeeping signal, and a plurality of series-connected counter means for producing output signals representative of present time, and display means, coupled to said counter means for displaying present time in response to signals produced thereby, the improvement comprising detecting means coupled to said timekeeping divider means for detecting at least one predetermined state of said divider stages comprising said divider timekeeping means, and in response thereto producing a detection pulse, and variable divider means coupled to said detection means and having a first and second division ratio, said variable divider means being adapted to receive said $2^{N-M}$ frequency signal and in response thereto divide same by a first division ratio and in response to each said detection pulse applied thereto divide said $10^{N-M}$ frequency pulse by said second division ratio, to thereby produce an output signal having a frequency evenly divisible by $10^P$ Hz.

18. An electronic timepiece as claimed in claim 17, wherein $N = 15$, $M = 8$, and $P = 1$.

19. An electronic timepiece as claimed in claim 18, and including chronographic counter means adapted to receive said variable divider means output signal and in response thereto produce chronographic signals representative of elapsed time.

* * * * *